US 12,087,682 B2

(12) United States Patent
Elsherbini et al.

(10) Patent No.: US 12,087,682 B2
(45) Date of Patent: Sep. 10, 2024

(54) POWER DELIVERY STRUCTURES

(71) Applicant: Intel Corporation, Santa Clara, CA (US)

(72) Inventors: Adel Elsherbini, Tempe, AZ (US);
Feras Eid, Chandler, AZ (US);
Georgios Dogiamis, Chandler, AZ (US); Beomseok Choi, Chandler, AZ (US); Henning Braunisch, Phoenix, AZ (US); William Lambert, Tempe, AZ (US); Krishna Bharath, Chandler, AZ (US); Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 933 days.

(21) Appl. No.: 16/907,797

(22) Filed: Jun. 22, 2020

(65) Prior Publication Data

US 2021/0398895 A1 Dec. 23, 2021

(51) Int. Cl.
*H01L 21/48* (2006.01)
*H01L 21/56* (2006.01)
(Continued)

(52) U.S. Cl.
CPC .......... *H01L 23/50* (2013.01); *H01L 21/4853* (2013.01); *H01L 21/563* (2013.01);
(Continued)

(58) Field of Classification Search
CPC ............... H01L 24/34–41; H01L 24/84; H01L 2224/34; H01L 2224/39; H01L 2224/401; H01L 2224/40105; H01L 2224/40151–40227; H01L 2224/40235; H01L 2224/40265; H01L 2224/411–41109; H01L 2224/41112–41175; H01L 2224/2405; H01L 2224/24051; H01L 2224/24105; H01L 2224/24151; H01L 2224/24153;
(Continued)

(56) References Cited

U.S. PATENT DOCUMENTS

2009/0194880 A1* 8/2009 Feng ................... H01L 29/7827
                                                              438/460
2009/0315172 A1* 12/2009 Lim ........................ H01L 24/83
                                                              438/122

(Continued)

*Primary Examiner* — Nicholas J Tobergte
*Assistant Examiner* — William Henry Anderson
(74) *Attorney, Agent, or Firm* — Essential Patents Group, LLP (57) ABSTRACT

An integrated circuit assembly may be fabricated having an electronic substrate, an integrated circuit device having a first surface, an opposing second surface, at least one side extending between the first surface and the second surface, and at least one through-substrate via extending into the integrated circuit device from the second surface, wherein the first surface of the integrated circuit device is electrically attached to the electronic substrate; and at least one power delivery route electrically attached to the second surface of the integrated circuit device and to the electronic substrate, wherein the at least one power delivery route is conformal to the side of the integrated circuit device and the first surface of the electronic substrate.

25 Claims, 8 Drawing Sheets

(51) Int. Cl.
    *H01L 23/00*    (2006.01)
    *H01L 23/31*    (2006.01)
    *H01L 23/367*    (2006.01)
    *H01L 23/48*    (2006.01)
    *H01L 23/50*    (2006.01)
    *H01L 25/00*    (2006.01)
    *H01L 25/065*    (2023.01)
    *H05K 1/18*    (2006.01)

(52) U.S. Cl.
    CPC ........ *H01L 23/3185* (2013.01); *H01L 23/367* (2013.01); *H01L 23/481* (2013.01); *H01L 23/562* (2013.01); *H01L 24/16* (2013.01); *H01L 25/0657* (2013.01); *H01L 25/50* (2013.01); *H05K 1/181* (2013.01); *H01L 2224/16227* (2013.01); *H01L 2225/06513* (2013.01); *H01L 2225/06517* (2013.01); *H01L 2225/06541* (2013.01); *H01L 2225/06565* (2013.01); *H01L 2924/18161* (2013.01)

(58) Field of Classification Search
    CPC . H01L 2224/24155; H01L 2224/24195; H01L 2224/24221; H01L 2224/24225; H01L 2224/24226; H01L 2224/24265; H01L 2224/2425; H01L 2224/242505; H01L 2224/25105; H01L 2224/25174; H01L 2224/25175; H01L 2224/25177; H01L 2224/273–27332; H01L 2224/27–27849; H01L 2224/321–32157; H01L 2224/32165; H01L 2224/32195; H01L 2224/32235; H01L 2224/32265; H01L 2224/33–3303; H01L 2224/331; H01L 2224/3318–33183; H01L 2224/3351–33515; H01L 2224/33519

See application file for complete search history.

(56)     References Cited

U.S. PATENT DOCUMENTS

| | | | |
|---|---|---|---|
| 2012/0086109 A1* | 4/2012 | Kim | H01L 21/561 257/659 |
| 2014/0175673 A1* | 6/2014 | Kim | H01L 24/06 257/777 |
| 2014/0183755 A1* | 7/2014 | Huang | H01L 23/49827 257/774 |
| 2015/0255381 A1* | 9/2015 | Kim | H01L 24/73 257/676 |
| 2019/0013262 A1* | 1/2019 | Hatori | H01L 24/84 |
| 2022/0254732 A1* | 8/2022 | Lee | H01L 21/563 |

* cited by examiner

POWER DELIVERY STRUCTURES

TECHNICAL FIELD

Embodiments of the present description generally relate to the field of integrated circuit package fabrication, and, more specifically, to an integrated circuit assembly including at least one integrated circuit device electrically attached to an electronic substrate and at least one power delivery structure extending between the electronic substrate and a second of the at least one integrated circuit device.

BACKGROUND

A typical integrated circuit package or assembly may comprise at least one integrated circuit device electrically attached to an electronic substrate, such as an interposer, a motherboard, or the like, with a plurality of solder bumps in a configuration generally known as a flip-chip or controlled collapse chip connection ("C4") configuration. The integrated circuit industry is continually striving to produce such integrated circuit packages to be ever faster, smaller, and thinner for use in various electronic products, including, but not limited to, computer servers and portable products, such as portable computers, electronic tablets, cellular phones, digital cameras, and the like.

As these goals are achieved, the integrated circuit devices and assemblies become smaller, which means that the electrical communication structures, e.g. metallization, solder bumps, and the like, become smaller. This, in turn, makes it more difficult to deliver (i.e. send and receive) signals and power (power supply routes and grounds routes). It is particularly an issue for high thermal design power ("TDP") compute dice (e.g. central processing units, graphics processors, and the like), which require significant power/electrical current to be delivered to the integrated circuit device from the electronic substrate. For integrated circuit assemblies using flip-chip attachment, as previously discussed, power delivery is generally achieved through power planes/traces within the electronic substrate to the solder bumps. As the power density within the integrated circuit device increases, the current per solder bump increases. However, the solder bumps can only carry a limited amount of current for reliability and power loss reasons. Thus, the number of solder bump connections used for power must increase. However, this competes with the solder connections needed for signal routes for the operation of the integrated circuit device, as well as the goal to decrease the size of the integrated circuit packages. Furthermore, decreasing the size of the integrated circuit packages includes a decease in the size of the electronic substrate, which, in turn, reduces the thickness of the power planes/traces within the electronic substrate and thereby increases the electrical resistance from a power source (such as a voltage regulator in the electronic substrate) to the integrated circuit device and results in additional power loss, as will be understood to those skilled in the art.

One technique for addressing these issues is to deliver power to both sides of the integrated circuit device, i.e. to an active surface of the integrated circuit device through the solder bumps and from the backside surface of the integrated circuit device by through-substrate vias extending into the integrated circuit device. However, the connections to the backside surface of the integrated circuit device are made with solder, which still poses a limit on the maximum power that can be delivered. Additionally, the structures to make the connections to backside surface of the integrated circuit device may interfere with the removal of heat from the backside surface of the integrated circuit device, as will be understood to those skilled in the art.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the formation of power delivery routes from an electronic substrate to an integrated circuit device attached to the electronic substrate. In one embodiment, an integrated circuit assembly may comprise an electronic substrate having a first surface; an integrated circuit device having a first surface, an opposing second surface, at least one side extending between the first surface and the second surface, and at least one through-substrate via extending into the integrated circuit device from the second surface, wherein the first surface of the integrated circuit device is electrically attached to the first surface of the electronic substrate; and at least one power delivery route electrically attached to the second surface of the integrated circuit device and to the first surface of the electronic substrate, wherein the at least one power delivery route is conformal to the side of the integrated circuit device and the first surface of the electronic substrate. In another embodiment, the power delivery routes may be formed with an additive process, such as a coldspray technique.

Figure 1:
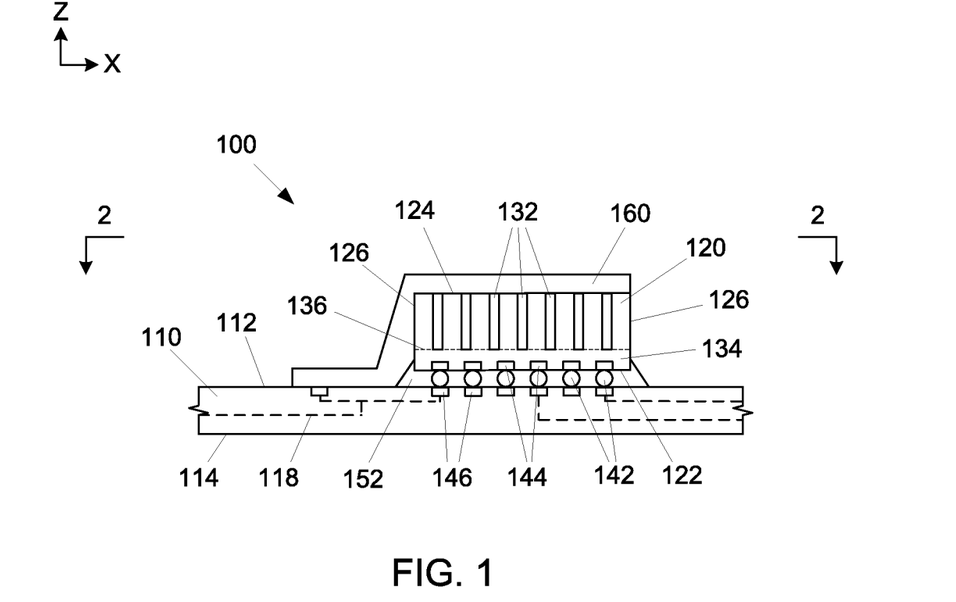
FIG. 1 is a side cross-sectional view of an integrated circuit assembly, according to one embodiment of the present description.

FIG. 1 illustrates an integrated circuit assembly 100 having at least one integrated circuit device 120 electrically attached to an electronic substrate 110 in a configuration generally known as a flip-chip or controlled collapse chip connection ("C4") configuration, according to an embodiment of the present description. The electronic substrate 110 may be any appropriate structure, including, but not limited to, an interposer, a motherboard, and the like. The electronic substrate 110 may have a first surface 112 and an opposing second surface 114. The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra-low-k dielectrics (dielectric constants less than about 3.6), including, but not limited to, carbon doped dielectrics, fluorine doped dielectrics, porous dielectrics, organic polymeric dielectrics, and the like.

The electronic substrate 110 may further include conductive routes 118 or "metallization" (shown in dashed lines) extending through the electronic substrate 110. As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity and conciseness. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 110 may be a cored substrate or a coreless substrate. In one embodiment of the present description, the electronic substrate 110 may comprise a silicon or glass interposer. In another embodiment of the present description, the electronic substrate 110 may include active and/or passive devices.

The integrated circuit device 120 may be any appropriate device, including, but not limited to, a microprocessor, a chipset, a graphics device, a wireless device, a memory device, an application specific integrated circuit, a transceiver device, an input/output device, combinations thereof, stacks thereof, and the like. As shown in FIG. 1, the at least one integrated circuit device 120 may each have a first surface 122, an opposing second surface 124, and at least one side 126 extending between the first surface 122 and the second surface 124.

The integrated circuit device 120 may include at least one through-substrate via 132 extending from the second surface 124 thereof to metallization and/or circuitry (not specifically illustrated) within an active area 134 demarked by a dashed line 136. The through-substrate vias 132 allow for the signal connection from the second surface 124 for the integrated circuit device 120, as will be understood to those skilled in the art. The processes and materials used in the formation of the through-substrate vias 132 are well known in the art, and, for the purposes of clarity and conciseness, will not be described herein. Further, the term "through-substrate vias" is merely a structural term and encompasses any material from which the integrated circuit device 120 may be made. For example, the structure within a silicon-based integrated circuit device may be referred to as a "through-silicon via". The structure with a glass-based integrated circuit device 120 may be referred to as a "through-glass via" and, likewise, for materials such as sapphire, III-V material substrates, and the like.

In an embodiment of the present description, the at least one integrated circuit device 120 may be electrically attached to the electronic substrate 110 with a plurality of device-to-substrate interconnects 142. In one embodiment of the present description, the device-to-substrate interconnects 142 may extend between bond pads 146 on the first surface 112 of the electronic substrate 110 and bond pads 144 on the first surface 122 of the integrated circuit device 120. The device-to-substrate interconnects 142 may be any appropriate electrically conductive material or structure, including, but not limited to, solder balls, metal bumps or pillars, metal filled epoxies, or a combination thereof. In one embodiment, the device-to-substrate interconnects 142 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 142 may be copper pads or pillars, e.g. for hybrid bonding. In a further embodiment, the device-to-substrate interconnects 142 may be metal bumps or pillars coated with a solder material. In still a further embodiment, the device-to-substrate interconnects 142 may be anisotropic conductive film.

The bond pads 144 may be in electrical communication with integrated circuitry (not shown) within the integrated circuit device 120. The bond pads 146 on the first surface 112 of the electronic substrate 110 may be in electrical contact with the conductive routes 118. The conductive routes 118 may be in electrical contact with exterior electrical components (not shown).

As further shown in FIG. 1, an electrically-insulating underfill material 152 may be disposed between the integrated circuit device 120 and the electronic substrate 110, which substantially encapsulates the device-to-substrate interconnects 142. The underfill material 152 may be used to reduce mechanical stress issues that can arise from thermal expansion mismatch between the electronic substrate 110 and the integrated circuit device 120. The underfill material 152 may be an epoxy material, including, but not limited to epoxy, cyanoester, silicone, siloxane and phenolic based resins, that has sufficiently low viscosity to be wicked between the integrated circuit device 120 and the electronic substrate 110 by capillary action when introduced by an underfill material dispenser (not shown), which will be understood to those skilled in the art. The underfill material 152 may be subsequently cured (hardened), such as by heat or radiation.

As shown in FIG. 1, at least one power delivery route 160 can be formed to extend from the through-substrate vias 132 at the second surface 124 of the integrated circuit device 120 to the first surface 112 of the electronic substrate 110. The at least one power delivery route 160 may be made of any appropriate conductive material, including but not limited to, metals, such as copper, silver, nickel, gold, and aluminum, alloys thereof, and the like. It is understood that the at least one power delivery route 160 may be a positive supply route or a ground route. Thus, with the embodiments of the present description, power supply routes and/or ground routes may be provided to the integrated circuit device through the second surface 124 of the integrated circuit device 120 or through both the first surface 122 and the second surface 124 of the integrated circuit device 120. As will be understood, the embodiments of the present description allow for the creation of relatively thick power delivery routes 160 which can significantly reduce impedance.

In one embodiment of the present description, the power delivery routes 160 may be electrically attached to one of the bond pads 146 on the first surface 112 of the electronic substrate 110. As will be understood, the attachment of the power delivery routes 160 does not require solder. Thus, the power delivery routes 160 may significantly improve the maximum power that can be delivered to the integrated circuit device 120 compare to known power delivery mechanisms, as previously discussed.

The at least one power delivery route 160 may be formed by an additive process, such as high throughput additive manufacturing ("HTAM"). In one embodiment, the power delivery route 160 may be formed with a "coldspray" HTAM process. As the coldspray process is known in the art, it will not be illustrated, but rather merely discussed herein. With a coldspray process, solid powders of a desired material or materials to be deposited are accelerated in a carrier jet (e.g. compressed air or nitrogen) by passing the jet through a converging diverging nozzle. The jet exits the nozzle at a high velocity and reaches the underlying substrate (e.g. the electronic substrate 110, the integrated circuit device 120, the underfill material 152, and the like), where the impact causes the solid particles in the jet to plastically deform and bond to the substrate. Subsequent layers of the material similarly adhere to each underlying layer upon continued jet impact, producing fast buildup (e.g. layers that are a few hundred microns thick can be deposited over an area of about 100-1000 mm$^2$ in a few seconds). Moreover, unlike thermal spraying techniques, this approach does not require melting the particles, thus protecting both the powders and the substrate from experiencing excessive processing temperatures. Because additive manufacturing, such as coldspray, is used, it eliminates the need for using lithography and the many steps associated with it (resist deposition, exposure, resist development, and resist removal) that are characteristic of subtractive or semi-additive methods, such as plating, sputtering, and the like. Additionally, 3D topography can be easily created, if needed, as will be understood to those skilled in the art. Moreover, different materials can be combined in the feed powder and used to create hybrid features in one step.

As the dielectric materials (not specifically shown) of the electronic substrate 110, particularly organic dielectric materials, may be relatively soft, the coldspray process may ablate the electronic substrate 110. Thus, in some embodiments, a buffer layer (not shown) may be formed on the electronic substrate 110 prior to forming the power delivery routes 160. The buffer layer may be formed from any appropriate material, including, but not limited to, metal, such as copper. The buffer layer may be formed by any known technique including sputtering or plating, and may be relatively thin depending on the material used. Furthermore, since the power delivery routes 160 will have interfaces with differing materials, such as the integrated circuit device 120, the underfill material 152, and the electronic substrate 110, interface adhesion improvement materials may be deposited prior to the formation of the power delivery routes 160.

In one embodiment of the present description, the at least one power delivery route 160 may be conformal to the components of the integrated circuit assembly 100. The term "conformal" for the purposes of the present description is defined to mean that at least one surface of the at least one power delivery route 160 "follows" the shape of or "conforms to" components of the integrated circuit assembly 100 to which the at least one power delivery route 160 is adjacent. In an embodiment of the present description, the at least one power delivery route 160 may be conformal to at least a portion of the at least one side of the integrated circuit device 120 and the first surface 112 of the electronic substrate 110. In a further embodiment of the present description, the at least one power delivery route 160 is conformal to at least a portion of the second surface 124 of the integrated circuit device 120. In still a further embodiment of the present description, the at least one power delivery route 160 is conformal to at least a portion of the underfill material 152.

In an embodiment of the present description, the at least one power delivery route 160 abuts at least a portion of the at least one side of the integrated circuit device 120 and the first surface 112 of the electronic substrate 110. In a further embodiment of the present description, the at least one power delivery route 160 abuts at least a portion of the second surface 124 of the integrated circuit device 120. In still a further embodiment of the present description, the at least one power delivery route 160 is conformal to at least a portion of the underfill material 152.

In one embodiment of the present description, the at least one power delivery route 160 may be a continuous conductive material. The term "continuous" for the purposes of the present description is defined to mean that the at least one power delivery route 160 is a single or bulk material without any parts or separate components.

Figure 2:
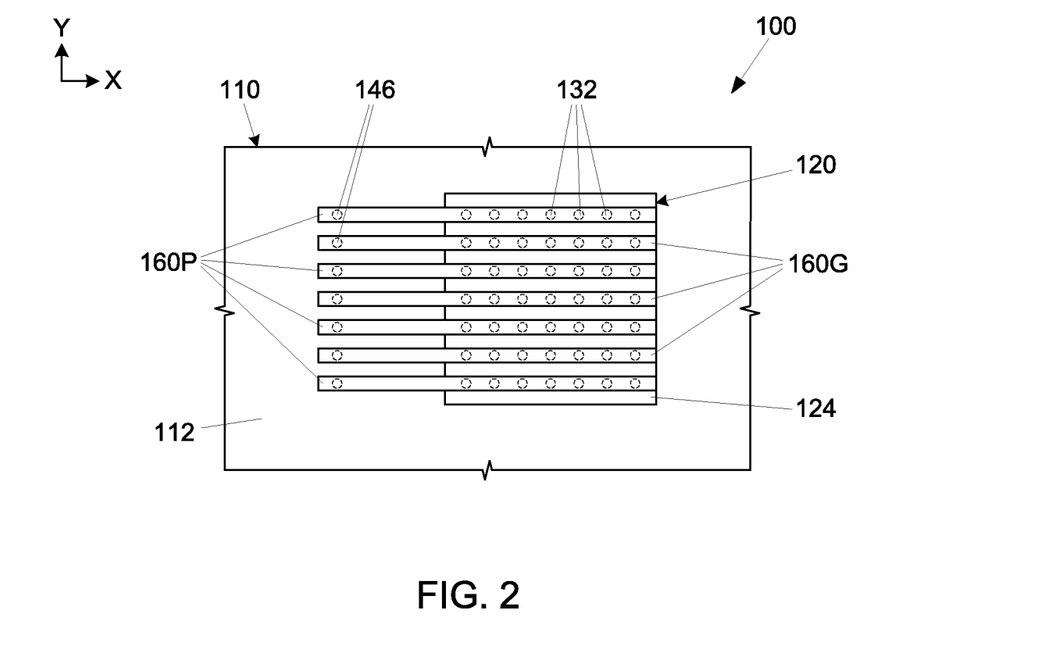
FIGS. 2 and 3 are top plan views along line 2-2 of FIG. 1, according to embodiments of the present description.

In an embodiment of the present description, as shown in FIG. 2, the at least one power delivery route 160 may be a combination of alternating positive supply routes (Vcc) 160P and ground routes (Vss) 160G. Additional components, such as dielectric material (not shown) between the positive supply routes 160P and the ground routes 160G, may be incorporated to effectuate the operation of the integrated circuit assembly 100. As will be understood to those skilled in the art, alternating or "interleaving" between the positive supply route 160P and the ground routes 160G may result in a lower IR drop and reduces inductance.

Figure 3:
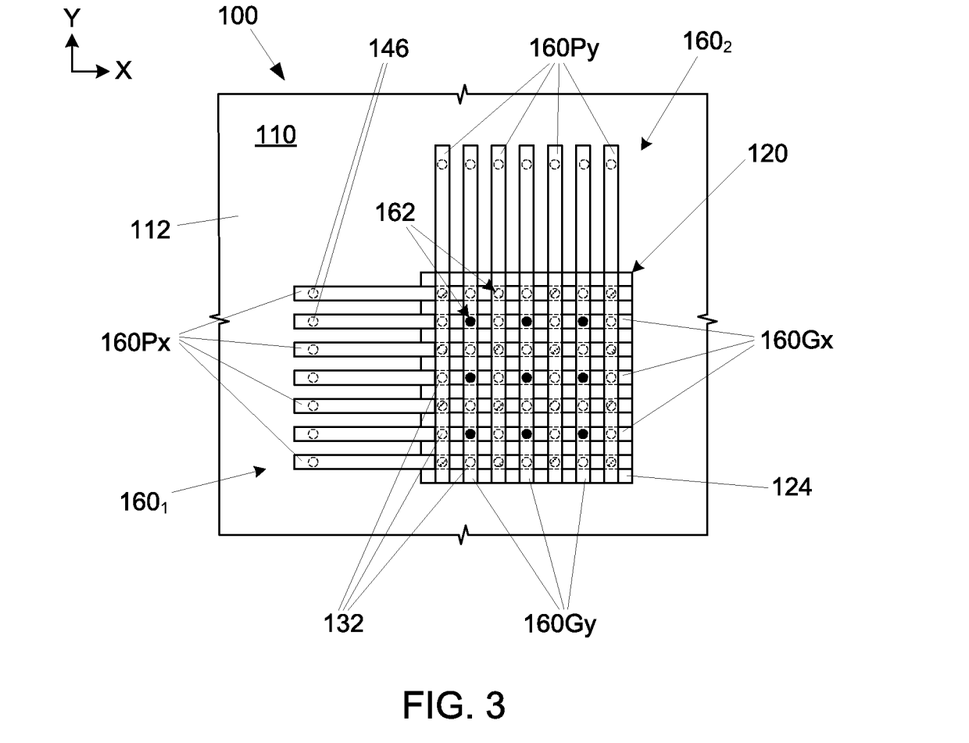

In a further embodiment of the present description, as shown in FIG. 3, the power delivery routes 160 may be stacked (i.e. in the z-direction—see FIG. 1) to form a multi-layer structure. A first layer $160_1$ may be a combination of alternating positive supply routes 160Px and ground routes 160Gx aligned in the x-direction and adjacent the second surface 124 of the integrated circuit device 120. A second layer $160_2$ may be formed on the first layer $160_1$ as a combination of alternating positive supply routes 160Py and ground routes 160Gy aligned in the y-direction. A dielectric layer (not shown) may be formed between the first layer $160_1$ and the second layer $160_2$ with openings (shown as opening locations 162) therethrough to electronically attach associated positive supply routes 160Px of the first layer $160_1$ and positive supply routes 160Gx of the second layer $160_2$ (denoted by cross hatched circles) and to electronically attach associated ground routes 160Gx of the first layer $160_1$ and ground routes 160Gy of the second layer $160_2$ (denoted by black circles). The dielectric layer (not shown) may be any appropriate dielectric having a moderate to high thermal conductivity, such as silicon nitride, aluminum nitride, and the like). The openings 162 may be formed by any technique known in the art, such as lithography, laser ablation, and the like. Additionally, when coldspraying is used to form the second layer $160_2$, the process may be tuned to ablate at the opening locations 162.

Figure 4:
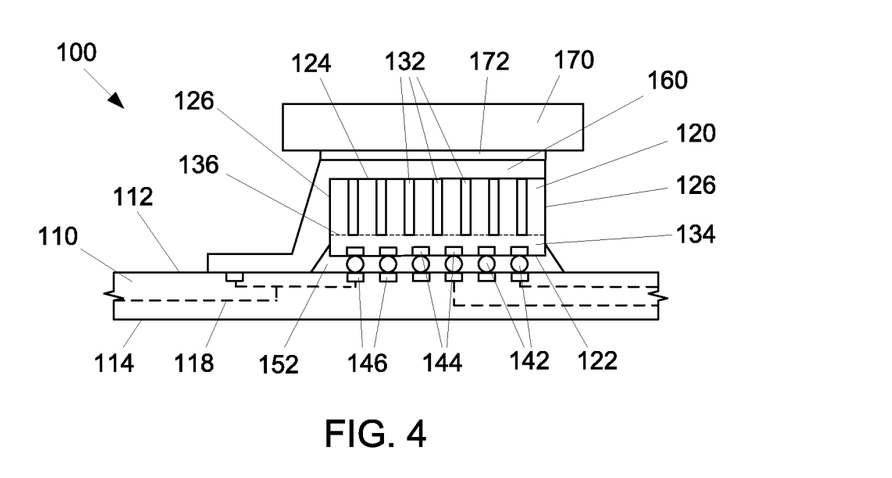
FIG. 4 is a side cross-sectional view of the embodiment of FIG. 1 having a heat spreader in thermal contact therewith, according to an embodiment of the present description.

As further shown in FIG. 4, the at least one power delivery route 160 may be thermally conductive, such that a heat dissipation device 170 (e.g. a heat spreader) may be thermally coupled with the at least one power delivery route 160 with a thermal interface material 172. The heat dissipation device 170 may be made of any appropriate thermally conductive material, including, but not limited to, at least one metal material and alloys of more than one metal, or highly doped glass or highly conductive ceramic material, such as aluminum nitride. In an embodiment of the present description, the heat dissipation device 170 may comprise copper, nickel, aluminum, alloys thereof, laminated metals including coated materials (such as nickel coated copper), and the like.

The heat dissipation device 170 may have additional thermal management devices (not shown) attached thereto for enhanced heat removal. Such additional thermal management devices (not shown) may include, but are not limited to, heat pipes, high surface area dissipation structures with a fan (such as a structure having fins or pillars/columns formed in a thermally conductive structure), liquid cooling devices, and the like, as will be understood to those skilled in the art.

In various embodiments of the present description, the thermal interface material 172 may be any appropriate, thermally conductive material, including, but not limited to, a thermal grease, a thermal gap pad, a polymer, an epoxy filled with high thermal conductivity fillers, such as metal particles or silicon particles, and the like.

Figure 5:
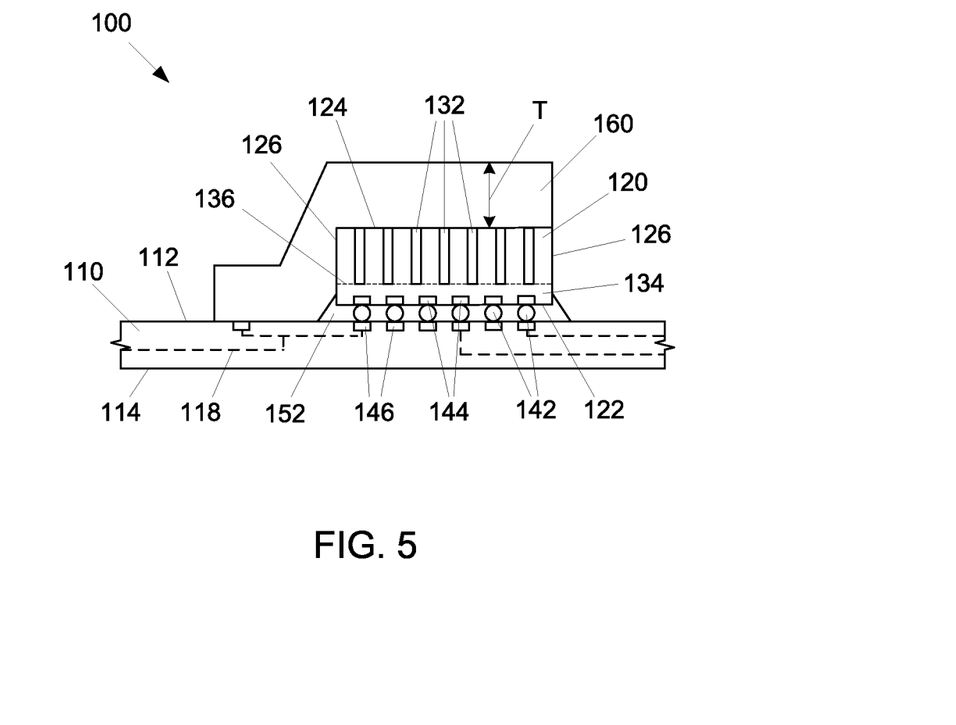
FIG. 5 is a side cross-sectional views of a power delivery structure having an enhanced thickness to function as a heat spreader, according to an embodiment of the present description.

As shown in FIG. 5, when the power delivery routes 160 are thermally conductive, they may be fabricated to have a thickness T sufficient for effective heat dissipation. Since in the embodiments of the present description have a direct thermal interface (contact) to the second surface 124 of the integrated circuit device 120, the power delivery routes 160 may themselves function as a heat dissipation device, which may have a better thermal performance compared with the embodiment of FIG. 4.

Figure 6:
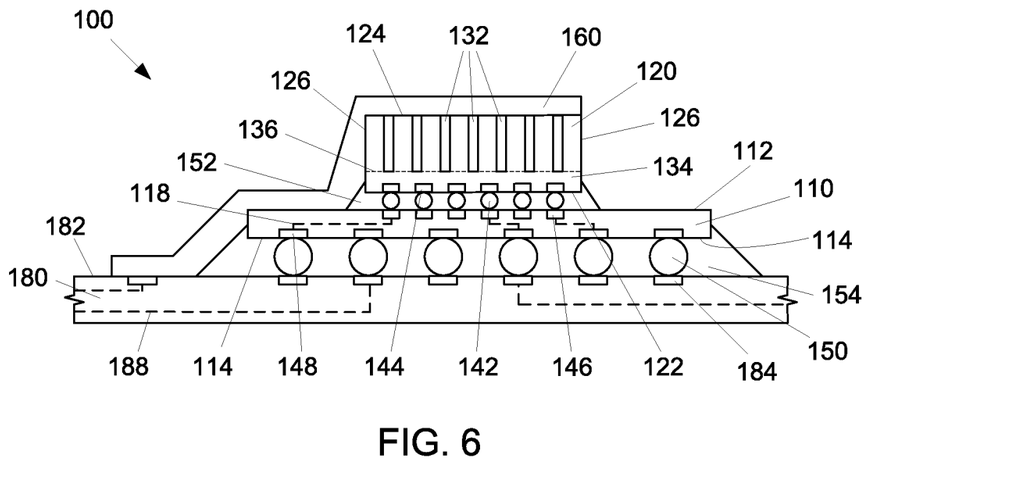
FIG. 6 is a view of a power delivery structure extending from a motherboard to an integrated circuit device in an integrated circuit package, according to one embodiment of the present description.

Although the embodiments are illustrated with one integrated circuit device and one electronic substrate 110, the embodiments are not so limited, as they apply equally to stacked integrated circuit devices, multi-device interposers, fan-out packages, flip-chip packages on printed circuit boards, and the like. For example, as shown in FIG. 6, the conductive routes 118 may extend through the electronic substrate 110 and be attached to bond pads 148 on the second surface 114 of the electronic substrate 110. As will be understood to those skilled in the art, the electronic substrate 110 may reroute a fine pitch (center-to-center distance between the bond pads) of the bond pads 142 on the first surface 112 of the electronic substrate 110 to a relatively wider pitch of the bond pads 148 on the second surface 114 of the electronic substrate 110. The electronic substrate 110 may be electrically attached to an electronic board 180 through a plurality of substrate-to-substrate interconnects 150 extending between the bond pads 148 on the second surface 114 of the electronic substrate 110 and a plurality of bond pads 184 on a first surface 182 of the electronic board 180. The substrate-to-substrate interconnects 150 may be any appropriate electrically conductive material, including, but not limited to, metal filled epoxies and solders.

The electronic board 180 may be any appropriate structure, including, but not limited to, a motherboard. The electronic board 180 may comprise a plurality of dielectric material layers (not shown) and may further include conductive routes 188 or "metallization" (shown in dashed lines) extending through the electronic board 180. As will be understood to those skilled in the art, the conductive routes 188 may be a combination of conductive traces (not shown) and conductive vias (not shown) extending through the plurality of dielectric material layers (not shown). These conductive traces and conductive vias are well known in the art and are not shown in FIG. 6 for purposes of clarity. As further shown in FIG. 6, an electrically-insulating underfill material 154 may be disposed between the electronic substrate 110 and the electronic board 180, which substantially encapsulates the substrate-to-substrate interconnects 150.

As shown in FIG. 6, at least one power delivery route 160 can be formed to extend from the through-substrate vias 132 at the second surface 124 of the integrated circuit device 120 to the first surface 182 of the electronic board 180. In one embodiment the power delivery routes 160 may be electrically attached to one of the bond pads 184 on the first surface 182 of the electronic board 180. In one embodiment of the present description, the at least one power delivery route 160 may be conformal to at least a portion of the first surface 182 of the electronic board 180. In a further embodiment of the present description, the at least one power delivery route 160 may be conformal to at least a portion of the underfill material 154.

In one embodiment of the present description, the at least one power delivery route 160 may abut at least a portion of the first surface 182 of the electronic board 180. In a further embodiment of the present description, the at least one power delivery route 160 may abut a portion of the underfill material 154.

Figure 7:
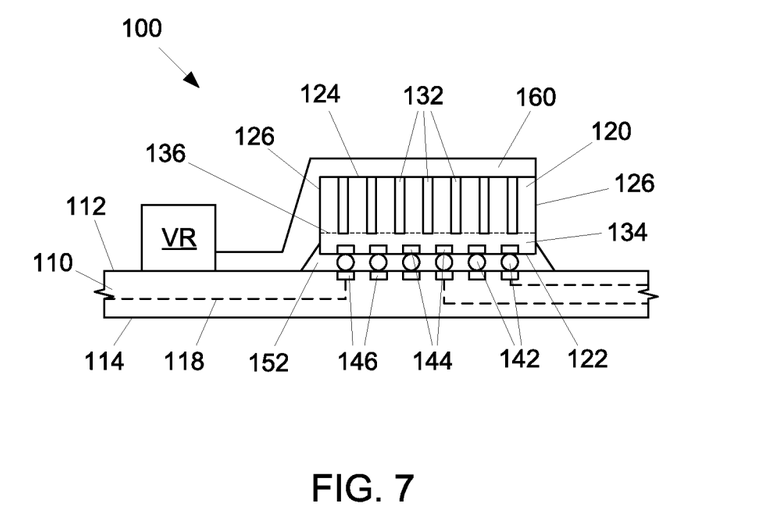
FIGS. 7 and 8 are side cross-sectional views of the use of power devices attached to an electronic substrate for delivering power signals to a power delivery structure, according to another embodiment of the present description.
Figure 8:
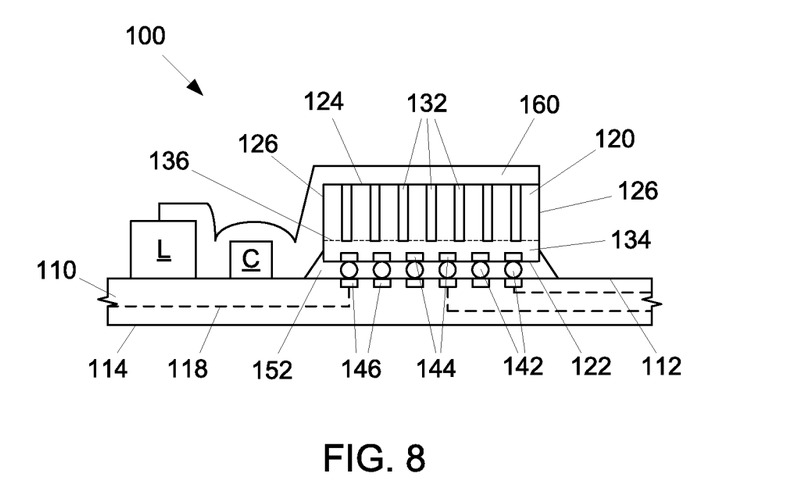

In some embodiments of the present description, as shown in FIGS. 7 and 8, power delivery need not come directly from the electronic substrate. As shown in FIG. 7, a voltage regulator VR may be attached to the first surface 112 of the electronic substrate 110 and the power delivery routes 160 may be electrically attached to the voltage regulator VR. Such a configuration can significantly reduce the resistance from the voltage regulator VR to the integrated circuit device 120. Additionally, as shown in FIG. 8, the power delivery routes 160 may be formed over the top of additional components, such as inductors I and capacitors C attached to first surface 112 of the electronic substrate 110 to reduce the routing limitations. This can be done through direct deposition of the power delivery routes 160 on specially designed discrete/integrated components, which may result in better thermal spreading, lower cost, and better z-height constraints. Alternatively, a topside protection material (not shown) may be used (e.g. board level underfill or sputtered dielectric) before depositing the power delivery routes 160.

Figure 9:
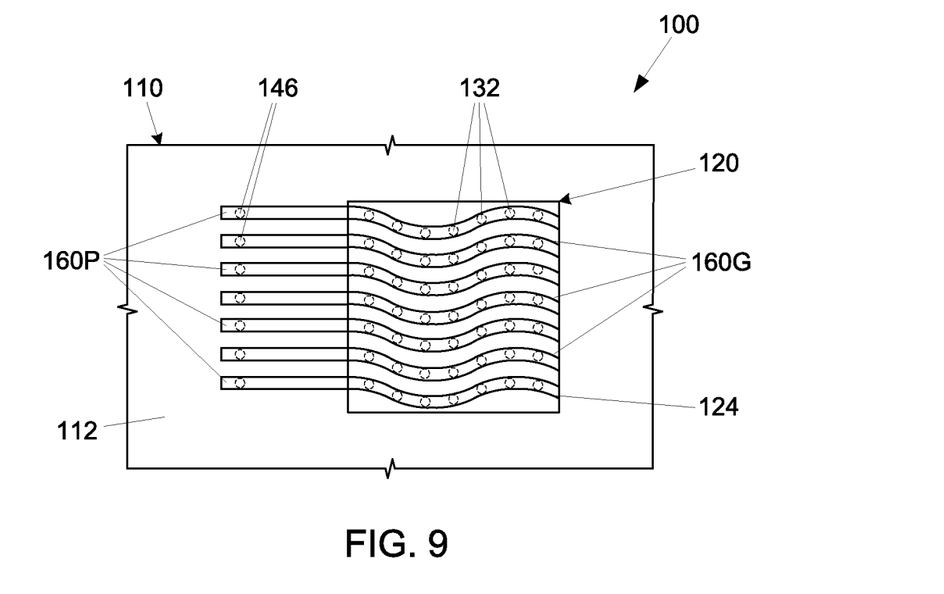
FIG. 9 is a side cross-sectional views of a power delivery structure having a serpentine shape for stress reduction, according to an embodiment of the present description.
Figure 10:
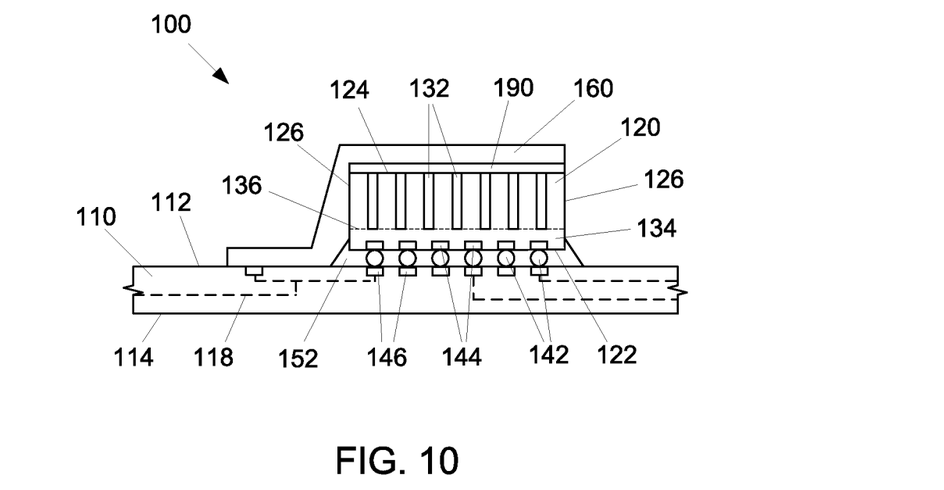
FIG. 10 is a side cross-sectional view of an integrated circuit assembly having a buffer layer between a power delivery structure and an integrated circuit device for stress reduction, according to an embodiment of the present description.

As will be understood to those skilled in the art, the power delivery routes 160 may introduce mechanical stresses on the integrated circuit device 120 that may limit the maximum thickness T (see FIG. 5) or the electrical performance of the power delivery routes 160. This may be reduced by forming non-linear power delivery routes 160 across the second surface 124 of the integrated circuit device 120. For example, as shown in FIG. 9, the non-linear power delivery routes 160 may be formed as serpentine or waving paths, according to one embodiment of the present description. According to another embodiment of the present description, the mechanical stresses may be reduced by forming a stress buffer layer 190 between the at least one power delivery route 160 and the second surface 124 of the integrated circuit device 120. The stress buffer layer 190 may be customized with a coefficient of thermal expansion and a modulus to reduce stresses within the integrated circuit device 120. In still another embodiment of the present description, stress buffer fill materials (not shown) may be incorporated into the power delivery routes 160 in all or a portion thereof along the second surface 124 of the integrated circuit device 120.

Figure 11:
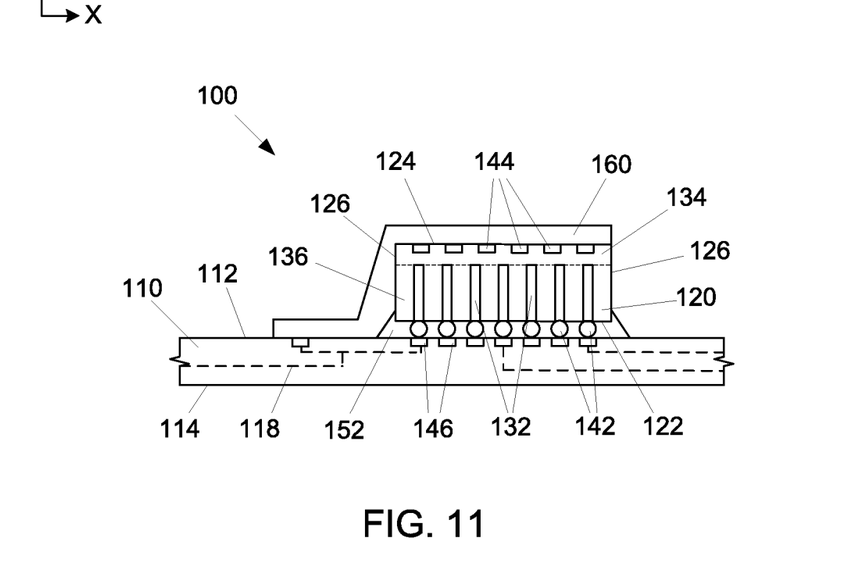
FIG. 11 is a side cross-sectional view of an integrated circuit assembly, according to one embodiment of the present description.
Figure 12:
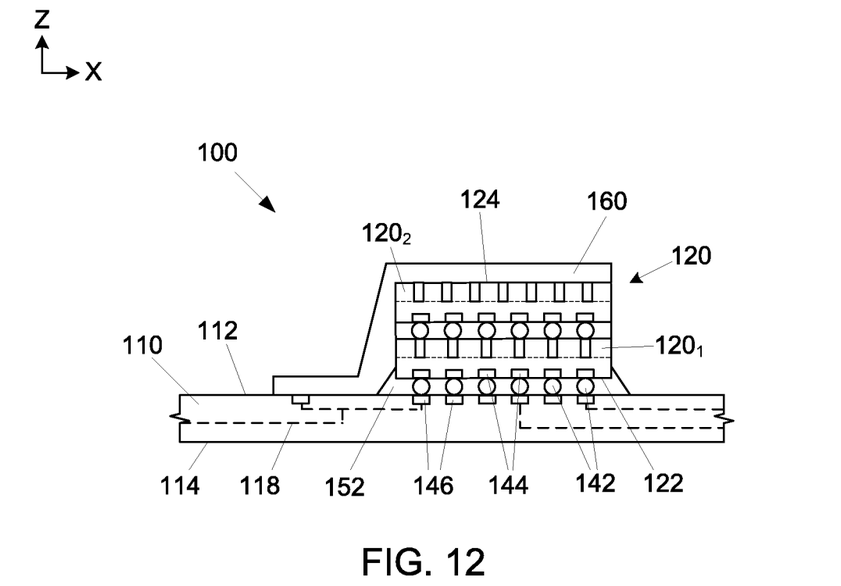
FIG. 12 is a side cross-sectional view of an integrated circuit assembly, according to another embodiment of the present description.

Although the embodiments illustrated in FIGS. 1-10 have the through-substrate vias 132 extending from the second surface 124 of the integrated circuit device 120, the orientation may be flipped such the active area 134 is adjacent the second surface 124 and the through-substrate vias 132 are connected to the electronic substrate 110, as shown in FIG. 11. This orientation may be advantageous for high power devices that do not require high numbers of signal line that need to be routed. Furthermore, although embodiments illustrated in FIGS. 1-11 show only a single integrated circuit die, the embodiments may include any number of components. For example, the integrated circuit device 120 may comprise multiple stacked dice (shown as a first die 1201 and a second die 1202 in FIG. 12), monolithically stacked device layers, combinations thereof, and the like.

Figure 13:
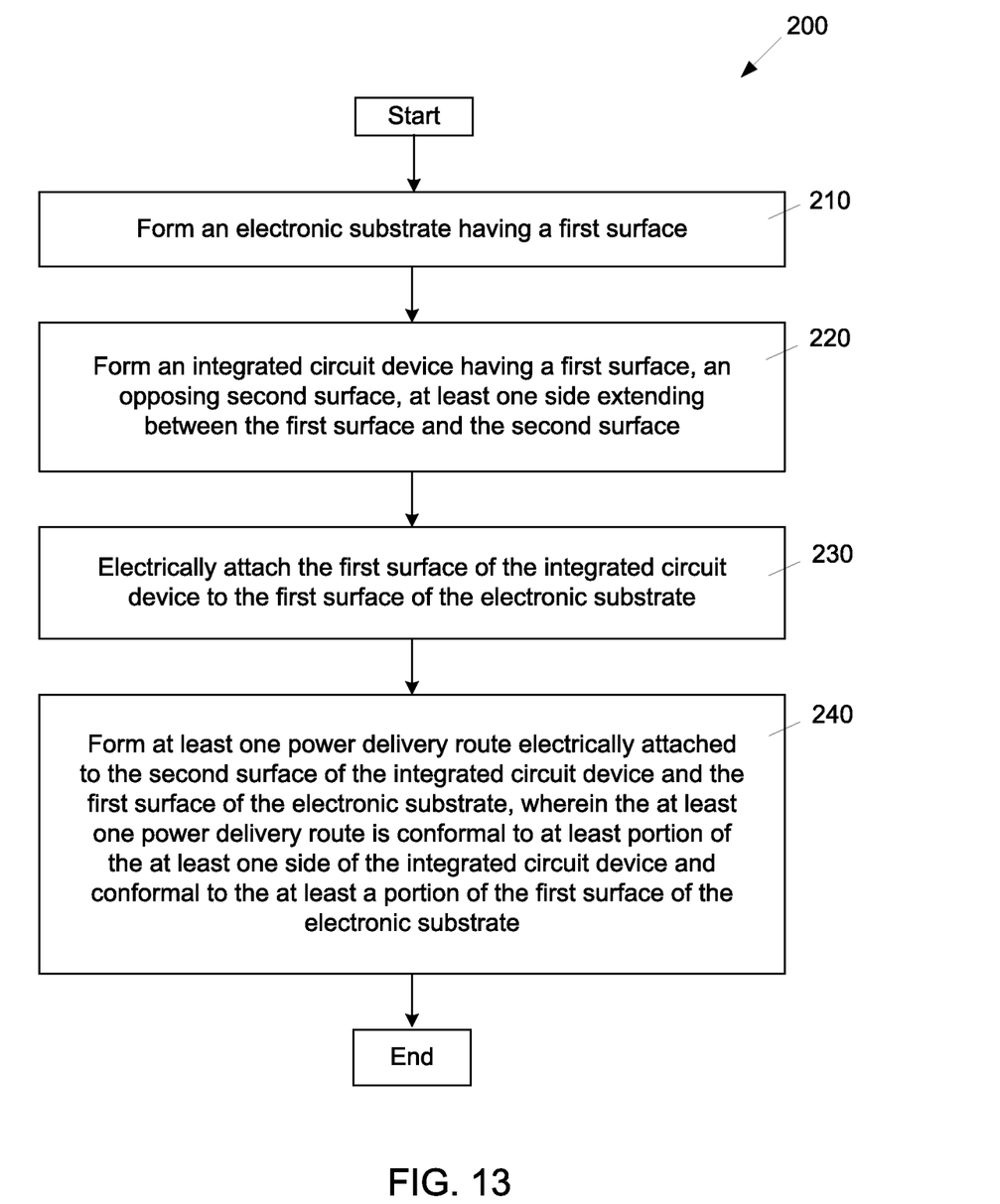
FIG. 13 is a flow chart of a process of fabricating an integrated circuit package, according to an embodiment of the present description.

FIG. 13 is a flow chart of a process 200 of fabricating an integrated circuit assembly according to an embodiment of the present description. As set forth in block 210, an electronic substrate having a first surface may be formed. An integrated circuit device may be formed having a first surface, an opposing second surface, and at least one side extending between the first surface and the second surface, and at least one through-substrate via extending into the integrated circuit device from the second surface, as set forth in block 220. As set forth in block 230, the first surface of the integrated circuit device may be electrically attached to the first surface of the electronic substrate. At least one power delivery route may be formed, wherein the at least one power delivery route is electrically attached to the at least one through-substrate via on the second surface of the integrated circuit device and the first surface of the electronic substrate, wherein the at least one power delivery route is conformal to the side of the integrated circuit device and the first surface of the first surface of the integrated circuit device, as set forth in block 240.

Figure 14:
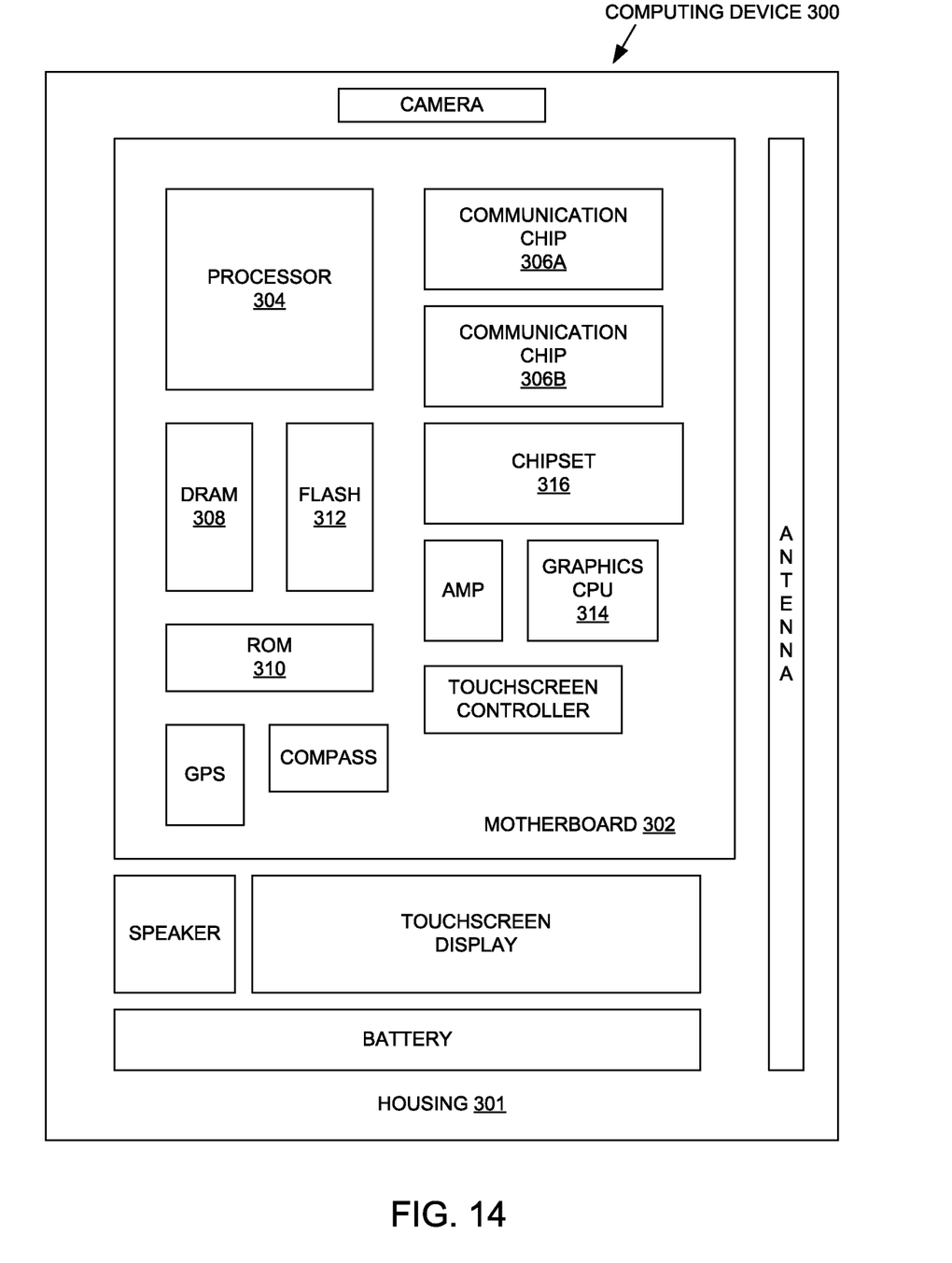
FIG. 14 is an electronic system, according to one embodiment of the present description.

FIG. 14 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising an electronic substrate having a first surface; an integrated circuit device having a first surface, an opposing second surface, and at least one side extending between the first surface and the second surface, wherein the first surface of the integrated circuit device is electrically attached to the first surface of the electronic substrate; and at least one power delivery route electrically attached to the second surface of the integrated circuit device and the electronic substrate, wherein the at least one power delivery route is conformal to the side of the integrated circuit device and the first surface of the electronic substrate.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-14. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an integrated circuit assembly comprising an electronic substrate having a first surface; an integrated circuit device having a first surface, an opposing second surface, at least one side extending between the first surface and the second surface, and at least one through-substrate via extending into the integrated circuit device from the second surface, wherein the first surface of the integrated circuit device is electrically attached to the first surface of the electronic substrate; and at least one power delivery route electrically attached to the at least one through-substrate via on the second surface of the integrated circuit device and the electronic substrate, wherein the at least one power delivery route is conformal to at least a portion of the at least one side of the integrated circuit device and conformal to at least a portion the first surface of the electronic substrate.

In Example 2, the subject matter of Example 1 can optionally include the integrated circuit device comprising at least one through-substrate via extending into the integrated circuit device from one of the second surface thereof, and wherein the at least one power delivery route is electrically attached to the at least one through-substrate via.

In Example 3, the subject matter of any of Examples 1 to 2 can optionally include the at least one power delivery route comprising a continuous conductive material.

In Example 4, the subject matter of any of Examples 1 to 3 can optionally include the at least one power delivery route being conformal to at least a portion of the second surface of the integrated circuit device.

In Example 5, the subject matter of any of Examples 1 to 4 can optionally include an underfill material between the electronic substrate and the integrated circuit device, and wherein the at least one power delivery route is conformal to at least a portion of the underfill material.

In Example 6, the subject matter of any of Examples 1 to 5 can optionally include a stress buffer layer between the at least one power delivery route and the second surface of the integrated circuit device.

In Example 7, the subject matter of any of Examples 1 to 6 can optionally include the at least one power delivery route being non-linear on the second surface of the integrated circuit device.

In Example 8, the subject matter of any of Example 1 to 7 can optionally include the at least one power delivery route comprising a plural of power delivery routes, wherein at least one power delivery route of the plural of power delivery routes comprises a power supply and wherein at least one power delivery route of the plural of power delivery routes comprises a ground.

In Example 9, the subject matter of any of Example 1 to 8 can optionally include at least one stacked power delivery route in a stacked configuration with and electrically attached to the at least one power delivery route on the second surface of the integrated circuit device.

Example 10 is an electronic system comprising an electronic board having a first surface, an integrated circuit assembly comprising an electronic substrate having a first surface and an opposing second surface and at least one side extending between the first surface and the second surface of the electronic substrate; and an integrated circuit device having a first surface, an opposing second surface, at least one side extending between the first surface and the second surface, and at least one through-substrate via extending into the integrated circuit device from the second surface, wherein the first surface of the integrated circuit device is electrically attached to the first surface of the electronic substrate, and wherein the second surface of the electronic substrate of the integrated circuit assembly is electrically attached to the first surface of the electronic board; and at least one power delivery route electrically attached to at least one through-substrate via on the second surface of the integrated circuit device and electrically attached to the first surface of the electronic board, wherein the at least one power delivery route is conformal to at least a portion of the side of the integrated circuit device, at least a portion of the first surface of the electronic substrate, at least a portion of the side of the electronic substrate, and at least a portion of the first surface of the electronic board.

In Example 11, the subject matter of Example 10 can optionally include the integrated circuit device comprising at least one through-substrate via extending into the integrated circuit device from one of the second surface thereof, and wherein the at least one power delivery route is electrically attached to the at least one through-substrate via.

In Example 12, the subject matter of any of Examples 10 to 11 can optionally include the at least one power delivery route comprising a continuous conductive material.

In Example 13, the subject matter of any of Examples 10 to 12 can optionally include the at least one power delivery route being conformal to the second surface of the integrated circuit device.

In Example 14, the subject matter of any of Examples 10 to 13 can optionally include an underfill material between the electronic substrate and the integrated circuit device, and wherein the at least one power delivery route is conformal to the underfill material.

In Example 15, the subject matter of any of Examples 10 to 14 can optionally include a stress buffer layer between the at least one power delivery route and the second surface of the integrated circuit device.

In Example 16, the subject matter of any of Examples 10 to 15 can optionally include the at least one power delivery route being non-linear on the second surface of the integrated circuit device.

In Example 17, the subject matter of any of Examples 10 to 16 can optionally include the at least one power delivery route comprising a plural of power delivery routes, wherein at least one power delivery route of the plural of power delivery routes comprises a power supply and wherein at least one power delivery route of the plural of power delivery routes comprise a ground.

In Example 18, the subject matter of any of Example 10 to 17 can optionally include at least one stacked power delivery route in a stacked configuration with and electrically attached to the at least one power delivery route on the second surface of the integrated circuit device.

Example 19 is a method of fabricating an integrated circuit assembly comprising forming an electronic substrate having a first surface; forming an integrated circuit device having a first surface, an opposing second surface, at least one side extending between the first surface and the second surface, and at least one through-substrate via extending into the integrated circuit device from the second surface, wherein the first surface of the integrated circuit device is electrically attached to the first surface of the electronic substrate; and forming at least one power delivery route electrically attached to the at least one through-substrate via on the second surface of the integrated circuit device and the electronic substrate, wherein the at least one power delivery route is conformal to the side of the integrated circuit device and the first surface of the electronic substrate.

In Example 20, the subject matter of Example 19 can optionally include forming the integrated circuit device comprising forming at least one through-substrate via extending into the integrated circuit device from one of the second surface thereof, and electrically attaching the at least one power delivery route to the at least one through-substrate via.

In Example 21, the subject matter of any of Examples 19 to 20 can optionally include forming the at least one power delivery route comprising forming a continuous conductive material.

In Example 22, the subject matter of any of Examples 19 to 21 can optionally include forming the at least one power delivery route comprising forming the at least one power delivery route to be conformal to the second surface of the integrated circuit device.

In Example 23, the subject matter of any of Examples 19 to 22 can optionally include forming an underfill material between the electronic substrate and the integrated circuit device, and wherein forming the at least one power delivery route comprises forming the at least one power delivery route to be conformal to the underfill material.

In Example 24, the subject matter of any of Examples 19 to 23 can optionally include forming a stress buffer layer between the at least one power delivery route and the second surface of the integrated circuit device.

In Example 25, the subject matter of any of Examples 19 to 24 can optionally include forming the at least one power delivery route comprises forming at least one non-linear power delivery route on the second surface of the integrated circuit device.

In Example 26, the subject matter of any of Example 19 to 25 can optionally include forming the at least one power delivery route comprising forming a plural of power delivery routes, wherein at least one power delivery route of the plural of power delivery routes comprises a power supply and wherein at least one power delivery route of the plural of power delivery routes comprise a ground.

In Example 27, the subject matter of any of Example 19 to 26 can optionally include forming at least one stacked power delivery route in a stacked configuration with and electrically attached to the at least one power delivery route on the second surface of the integrated circuit device.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
   an electronic substrate having a first surface;
   an integrated circuit device having a first surface, an opposing second surface, and at least one side extending between the first surface and the second surface, wherein the first surface of the integrated circuit device is electrically attached to the first surface of the electronic substrate; and
   at least one power delivery route electrically attached to the second surface of the integrated circuit device and the first surface of the electronic substrate, wherein the at least one power delivery route is conformal to at least a portion of the at least one side of the integrated circuit device and conformal to at least a portion of the first surface of the electronic substrate, and wherein the at least one power delivery route comprises a plurality of power delivery routes, wherein at least one power delivery route of the plurality of power delivery routes comprises a power supply and wherein at least one power delivery route of the plurality of power delivery routes comprises a ground.

2. The integrated circuit assembly of claim 1, wherein the integrated circuit device comprises at least one through-substrate via extending into the integrated circuit device from the second surface thereof, and wherein the at least one power delivery route is electrically attached to the at least one through-substrate via.

3. The integrated circuit assembly of claim 1, wherein the at least one power delivery route is conformal to at least a portion of the second surface of the integrated circuit device.

4. The integrated circuit assembly of claim 1, further comprising an underfill material between the electronic substrate and the integrated circuit device, wherein the at least one power delivery route is conformal to at least a portion of the underfill material.

5. The integrated circuit assembly of claim 1, further comprising a stress buffer layer between the at least one power delivery route and the second surface of the integrated circuit device.

6. The integrated circuit assembly of claim 1, further comprising at least one stacked power delivery route in a stacked configuration with and electrically attached to the at least one power delivery route on the second surface of the integrated circuit device.

7. An electronic system, comprising:
   an electronic board having a first surface;
   an integrated circuit assembly comprising:
      an electronic substrate having a first surface and an opposing second surface and at least one side extending between the first surface and the second surface of the electronic substrate; and
      an integrated circuit device having a first surface, an opposing second surface, and at least one side extending between the first surface and the second surface; wherein the first surface of the integrated circuit device is electrically attached to the first surface of the electronic substrate, wherein the second surface of the electronic substrate of the integrated circuit assembly is electrically attached to the first surface of the electronic board, and wherein the integrated circuit device comprises at least one through-substrate via extending into the integrated circuit device from the second surface thereof; and
   at least one power delivery route electrically attached to the second surface of the integrated circuit device and electrically attached to the first surface of the electronic board, wherein the at least one power delivery route is conformal to at least a portion of the at least one side of the integrated circuit device, at least a portion of the first surface of the electronic substrate, at least a portion of the at least one side of the electronic substrate, and at least a portion of the first surface of the electronic board, and wherein the at least one power delivery route is electrically attached to the at least one through-substrate via.

8. The electronic system of claim 7, wherein the at least one power delivery route is conformal to at least a portion of the second surface of the integrated circuit device.

9. The electronic system of claim 7, further comprising an underfill material between the electronic substrate and the integrated circuit device, wherein the at least one power delivery route is conformal to at least a portion of the underfill material.

10. The electronic system of claim 7, further comprising a stress buffer layer between the at least one power delivery route and the second surface of the integrated circuit device.

11. The electronic system of claim 7, wherein the at least one power delivery route is non-linear on the second surface of the integrated circuit device.

12. The electronic system of claim 7, wherein the at least one power delivery route comprises a plurality of power delivery routes, wherein at least one power delivery route of the plurality of power delivery routes comprises a power supply and wherein at least one power delivery route of the plurality of power delivery routes comprises a ground.

13. The electronic system of claim 7, further comprising at least one stacked power delivery route in a stacked configuration with and electrically attached to the at least one power delivery route on the second surface of the integrated circuit device.

14. An integrated circuit assembly, comprising:
an electronic substrate having a first surface;
an integrated circuit device having a first surface, an opposing second surface, and at least one side extending between the first surface and the second surface, wherein the first surface of the integrated circuit device is electrically attached to the first surface of the electronic substrate; and
at least one power delivery route electrically attached to the second surface of the integrated circuit device and the first surface of the electronic substrate, wherein the at least one power delivery route is conformal to at least a portion of the at least one side of the integrated circuit device and conformal to at least a portion of the first surface of the electronic substrate, and wherein the at least one power delivery route is non-linear on the second surface of the integrated circuit device.

15. The integrated circuit assembly of claim 14, wherein the integrated circuit device comprises at least one through-substrate via extending into the integrated circuit device from the second surface thereof, and wherein the at least one power delivery route is electrically attached to the at least one through-substrate via.

16. The integrated circuit assembly of claim 14, further comprising a stress buffer layer between the at least one power delivery route and the second surface of the integrated circuit device.

17. The integrated circuit assembly of claim 14, wherein the at least one power delivery route is conformal to at least a portion of the second surface of the integrated circuit device.

18. The integrated circuit assembly of claim 14, further comprising an underfill material between the electronic substrate and the integrated circuit device, wherein the at least one power delivery route is conformal to at least a portion of the underfill material.

19. The integrated circuit assembly of claim 14, wherein the at least one power delivery route comprises a plurality of power delivery routes, wherein at least one power delivery route of the plurality of power delivery routes comprises a power supply and wherein at least one power delivery route of the plurality of power delivery routes comprises a ground.

20. The integrated circuit assembly of claim 14, further comprising at least one stacked power delivery route in a stacked configuration with and electrically attached to the at least one power delivery route on the second surface of the integrated circuit device.

21. An integrated circuit assembly, comprising:
an electronic substrate having a first surface;
an integrated circuit device having a first surface, an opposing second surface, and at least one side extending between the first surface and the second surface, wherein the first surface of the integrated circuit device is electrically attached to the first surface of the electronic substrate;
at least one power delivery route electrically attached to the second surface of the integrated circuit device and the first surface of the electronic substrate, wherein the at least one power delivery route is conformal to at least a portion of the at least one side of the integrated circuit device and conformal to at least a portion of the first surface of the electronic substrate; and
at least one stacked power delivery route in a stacked configuration with and electrically attached to the at least one power delivery route on the second surface of the integrated circuit device.

22. The integrated circuit assembly of claim 21, wherein the integrated circuit device comprises at least one through-substrate via extending into the integrated circuit device from the second surface thereof, and wherein the at least one power delivery route is electrically attached to the at least one through-substrate via.

23. The integrated circuit assembly of claim 21, wherein the at least one power delivery route is conformal to at least a portion of the second surface of the integrated circuit device.

24. The integrated circuit assembly of claim 21, further comprising an underfill material between the electronic substrate and the integrated circuit device, wherein the at least one power delivery route is conformal to at least a portion of the underfill material.

25. The integrated circuit assembly of claim 21, further comprising a stress buffer layer between the at least one power delivery route and the second surface of the integrated circuit device.

* * * * *